United States Patent [19]

Rossman et al.

[11] Patent Number: 6,121,161

[45] Date of Patent: Sep. 19, 2000

[54] REDUCTION OF MOBILE ION AND METAL CONTAMINATION IN HDP-CVD CHAMBERS USING CHAMBER SEASONING FILM DEPOSITIONS

[75] Inventors: Kent Rossman, Sunnyvale; Turgut Sahin, Cupertino, both of Calif.; Hichem M'Saad, Grenoble, France; Romuald Nowak, Cupertino, Calif.

[73] Assignee: Applied Materials, Inc., Santa Clara, Calif.

[21] Appl. No.: 09/233,366

[22] Filed: Jan. 19, 1999

Related U.S. Application Data

[62] Division of application No. 08/872,722, Jun. 11, 1997, abandoned.

[51] Int. Cl.⁷ .................................................. H01L 21/31
[52] U.S. Cl. ........................................... 438/783; 438/800
[58] Field of Search .................................. 438/783, 800, 438/758; 34/491; 126/653

[56] References Cited

U.S. PATENT DOCUMENTS

| | | | |
|---|---|---|---|
| 3,591,827 | 7/1971 | Hall et al. | 315/108 |
| 4,099,924 | 7/1978 | Berkman et al. | 117/211 |
| 4,579,080 | 4/1986 | Martin et al. | 118/500 |
| 4,960,488 | 10/1990 | Law et al. | 156/643 |
| 4,993,357 | 2/1991 | Scholz | 118/715 |
| 5,011,705 | 4/1991 | Tanaka | 427/39 |
| 5,041,311 | 8/1991 | Tsukune et al. | 427/579 |
| 5,045,346 | 9/1991 | Tabasky et al. | 427/39 |
| 5,129,958 | 7/1992 | Nagashima et al. | 134/22.1 |
| 5,201,990 | 4/1993 | Chang et al. | 156/643 |
| 5,221,414 | 6/1993 | Langley et al. | 156/626 |
| 5,244,730 | 9/1993 | Nguyen et al. | 428/336 |
| 5,304,405 | 4/1994 | Kobayashi et al. | 427/534 |
| 5,322,444 | 6/1994 | George et al. | 439/310 |
| 5,366,585 | 11/1994 | Roertson et al. | 156/643 |
| 5,429,995 | 7/1995 | Nishiyama et al. | 427/238 |
| 5,431,964 | 7/1995 | Rivoire | 427/535 |
| 5,476,547 | 12/1995 | Mikoshiba et al. | 118/726 |
| 5,549,935 | 8/1996 | Nguyen et al. | 427/490 |
| 5,558,717 | 9/1996 | Zhao et al. | 118/715 |
| 5,571,571 | 11/1996 | Musaka et al. | 427/574 |
| 5,589,233 | 12/1996 | Law et al. | 427/579 |
| 5,614,055 | 3/1997 | Fairbairn et al. | 156/345 |

FOREIGN PATENT DOCUMENTS

| | | | |
|---|---|---|---|
| 0 299 245 A1 | 1/1989 | European Pat. Off. | C23C 16/34 |
| 0 387 656 A1 | 9/1990 | European Pat. Off. | C23C 16/44 |
| 0 574 935 A1 | 12/1993 | European Pat. Off. | H01L 21/00 |
| 58-92217 | 6/1983 | Japan | H01L 21/205 |
| 58-92218 | 8/1983 | Japan | H01L 21/205 |

OTHER PUBLICATIONS

Martinet, F., "Method to reduce flaking and facilitate cleaning of plasma deposition systems," *IBM Technical Disclosure Bulletin*, 22(9):4039 (Feb. 1980).

Wolf, S., "Silicon processing for the VLSI era vol. 2—Process Integration" Lattice press, Sunset Beach, CA USA, p. 197.

*Primary Examiner*—Charles Bowers
*Assistant Examiner*—Craig Thompson
*Attorney, Agent, or Firm*—Townsend & Townsend & Crew

[57] ABSTRACT

A method and apparatus for controlling the introduction of contaminates into a deposition chamber that occur naturally within the chamber components. The CVD chamber is "seasoned" with a protective layer after a dry clean operation and before a substrate is introduced into the chamber. The deposited seasoning layer has a lower diffusion rate for typical contaminants in relation to the chamber component materials and covers the chamber component, reducing the likelihood that the naturally occurring contaminants will interfere with subsequent processing steps. After deposition of the seasoning layer is complete, the chamber is used for one to n substrate deposition steps before being cleaned by another clean operation as described above and then reseasoned.

8 Claims, 5 Drawing Sheets

REDUCTION OF MOBILE ION AND METAL CONTAMINATION IN HDP-CVD CHAMBERS USING CHAMBER SEASONING FILM DEPOSITIONS

This application is a division of and claims the benefit of U.S. application Ser. No. 08/872,722 filed Jun. 11, 1997 now abandoned, the disclosure of which is incorporated by reference.

BACKGROUND OF THE INVENTION

The present invention relates to the fabrication of integrated circuits. More particularly, the invention provides a technique, including a method and apparatus, for improving the quality of films deposited in a substrate processing chamber. The present invention is particularly useful for improving the quality of undoped silicate glass (USG) films deposited by chemical vapor deposition processing, but may also be applied to a number of other types of films, including, merely by way of example, fluorosilicate glass (FSG), phosphorous-doped silicate glass (PSG), boron nitride (BN) and amorphous carbon), as well as to films deposited by other deposition techniques.

One of the primary steps in the fabrication of modern semiconductor devices is the formation of a thin film on a semiconductor substrate by chemical reaction of gases. Such a deposition process is referred to as chemical vapor deposition (CVD). Conventional thermal CVD processes supply reactive gases to the substrate surface where heat-induced chemical reactions can take place to produce the desired film. Plasma CVD processes promote the activation of the reactant gases, typically by the application of radio frequency (RF) energy to excite the reactant gases, thereby creating a plasma. The high reactivity of the activated reactant gases reduces the energy required for a chemical reaction to take place, and thus lowers the required temperature for such CVD processes. The relatively low temperature of a plasma CVD process makes such processes ideal for the formation of insulating layers over deposited metal layers and for the formation of other insulating layers. A high density plasma CVD (HDP-CVD) process is similar to the plasma CVD process described above, but an HDP process uses inductive energy rather than capacitive energy.

In one prior art HDP-CVD deposition chamber, the vacuum chamber is generally defined by a planar substrate support, acting as a cathode, along the bottom, a planar anode along the top, a relatively short sidewall extending upwardly from-the bottom, and a dielectric sidewall connecting the short sidewall with the top. Inductive coils are mounted about the dielectric sidewall and are connected to a supply radio frequency generator. The top and bottom electrodes are typically coupled to bias radio frequency generators. Two or more sets of equally spaced gas distributors, such as nozzles, are typically mounted to the sidewall and extend into the region above the edge of the substrate support-surface. The gas nozzles for each set are coupled to a common manifold for that set; the manifolds provide the gas nozzles with process gases, including gases such as argon, oxygen, silane ($SiH_4$), TEOS (tetraethoxysilane), silicon tetrafluoride ($SiF_4$), etc., the composition of the gases depending primarily on the type of material to be formed on the substrate. Sets of gas nozzles are commonly used because some gases, such as silane, need to be delivered into the chamber separately from other gases, such as oxygen; other gases, such as oxygen and $SiF_4$, can be delivered to a common set of nozzles through a common manifold. The nozzle tips have exits, typically orifices, positioned in a circumferential pattern spaced apart above the circumferential periphery of the substrate support and through which the process gases flow.

Possible contamination of the deposition process is always a concern. For example, during deposition of silicon oxide and other layers onto the surface of a substrate, the deposition gases released inside the processing chamber cause unavoidable deposition on areas such as the walls of the processing chamber. Unless removed, this unwanted deposition is a source of contaminates that may interfere with subsequent processing steps and adversely affect wafer yield. To avoid such problems, the inside surface of the chamber is regularly cleaned to remove the unwanted deposition material from the chamber walls and similar areas of the processing chamber. This procedure is performed as a dry clean operation where an etchant gas, such as nitrogen trifluorine ($NF_3$), is used to remove (etch) the deposited material from the chamber walls and other areas. The etchant gas is introduced into the chamber and a plasma is formed so that the etchant gas reacts with and removes the deposited material from the chamber walls. Such cleaning procedures are commonly performed between deposition steps for every wafer or every n wafers.

However, there are other sources of contamination, such as those contaminates inherent to the deposition chamber itself, that are not eliminated by the cleaning process described above. For example, in the HDP-CVD chamber described above, the dielectric sidewall may be formed of a quartz, silicon oxide ($SiO_2$) material or of alumina ($Al_2O_3$), the nozzles are typically formed of alumina and the chamber body itself is typically formed of aluminum (Al). Each of these materials is a potential source of contamination, including, for example, sodium (Na), lithium (Li), potassium (K), aluminum (Al), iron (Fe), chromium (Cr) and nickel (Ni). Since the contaminates occur naturally within the chamber components, they are generally not eliminated by the above cleaning process and therefore can interfere with processing steps and adversely affect wafer yield.

As an example, it has been observed that sodium is a particularly disruptive contaminant to the deposition process. It is believed that a high level of sodium contamination in the deposition chamber can arise from the relatively high diffusion rate of sodium contaminates or ions through silicon oxide and alumina surfaces. Therefore, it is believed that during wafer processing in a plasma reactor, sodium diffuses through the quartz dome and alumina nozzles until they are free within the chamber, where they become incorporated with and contaminate the deposited film.

A known method of controlling the introduction of contaminates into the deposition chamber involves depositing a "seasoning" layer of silicon oxide over the chamber's interior surface prior to processing substrate films. For example, the clean step described above can, in itself, be a source of particle accumulation. Fluorine from the clean plasma can be absorbed and/or trapped in the chamber walls and can be released during subsequent processing steps. The deposited silicon oxide seasoning layer covers the absorbed fluorine, reducing the likelihood that it will contaminate subsequent processing steps. However, depositing a seasoning layer of silicon oxide does not protect against sodium contamination, for example, because of the relatively high diffusion rate of sodium through silicon oxide to begin with.

Thus, an improved method and apparatus are desired for controlling the introduction of contamination into the deposition chamber that occur naturally within the chamber components.

SUMMARY OF THE INVENTION

The present invention provides an improved method and apparatus for controlling the contamination of a deposition chamber that occurs naturally within the chamber components. The CVD chamber is "seasoned" with a protective layer after a dry clean operation and before a substrate is introduced into the chamber. The deposited seasoning layer covers the chamber component materials, reducing the likelihood that the naturally occurring contaminants will interfere with subsequent processing steps. After deposition of the seasoning layer is complete, the chamber is used for one to n substrate deposition steps before being cleaned by another clean operation as described above and then reseasoned.

The seasoning layer controls chamber contamination because the diffusion rate of the typical contaminates through the seasoning layer is much lower than the diffusion rate through the chamber component materials, such as silicon oxide and alumina. Thus, the contaminates are not as likely to diffuse through both the chamber component materials and the protective seasoning layer and contaminate the film being deposited on the substrate. Preferred seasoning layers include silicon nitride (SiN), silicon oxynitride (SiON) and phosphorous-doped silicate glass (PSG), each of which limits the diffusion of contaminates into the deposition chamber. In an alternate embodiment, a precursor seasoning layer, such as a silicon oxide layer, is introduced to the chamber before depositing the protective seasoning layer. The protective seasoning layer adheres more uniformly to the underlying precursor layer than to the chamber components, providing improved contamination control.

DESCRIPTION OF THE PREFERRED EMBODIMENT

1. An Exemplary CVD System

Figure 1A:
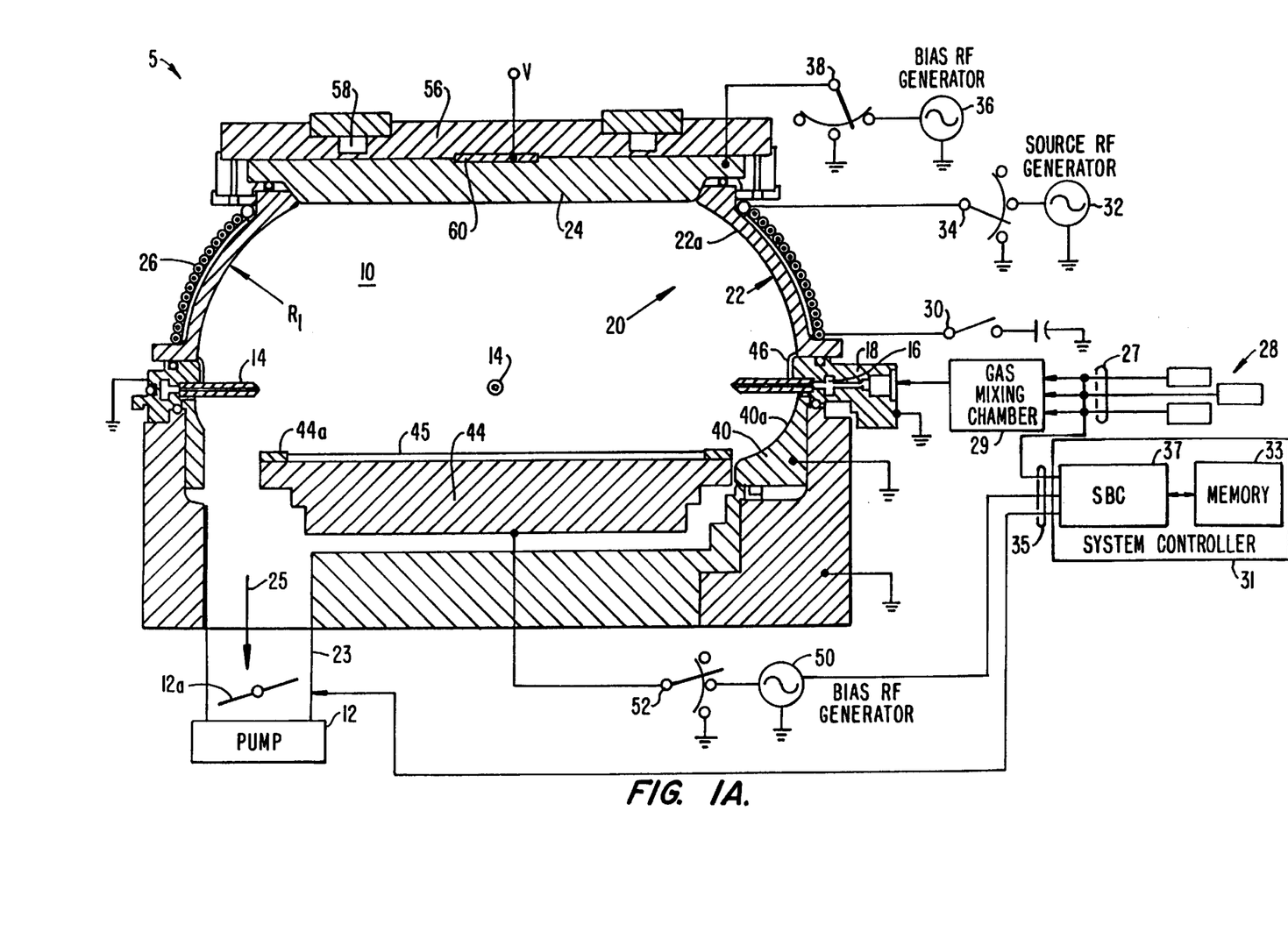
FIG. 1A is a vertical, cross-sectional view of one embodiment of a simplified high density chemical vapor deposition apparatus according to the present invention.

FIG. 1A illustrates one embodiment of a high density plasma (HDP) CVD system 5 in which the dielectric layer according to the present invention can be deposited. HDP-CVD system 5 includes a vacuum chamber 10, a vacuum pump 12, a bias RF (BRF) generator 36, and a source RF (SRF) generator 32.

Vacuum chamber 10 includes a ceiling 12 consisting of a sidewall 22 and a disk-shaped ceiling electrode 24. Sidewall 22 is made of an insulator such as quartz or ceramic and supports coiled antenna 26. The structural details of coiled antenna 26 are disclosed in U.S. patent application Ser. No. 08/113,776 entitled "High Density Plasma CVD and Etching Reactor," by Fairbairn and Nowak, filed Aug. 27, 1993, the disclosure of which is incorporated herein by reference.

Deposition gases and liquids are supplied from gas sources 28 through lines 27, having control valves not shown, into a gas mixing chamber 29 where they are combined and sent to gas supply ring manifold 16. Generally, each gas supply line for each process gas includes (i) safety shut-off valves (not shown) that can be used to automatically or manually shut off the flow of process gas into the chamber, and (ii) mass flow controllers (MFCs) (also not shown) that measure the flow of gas through the gas supply lines. When toxic gases are used in the process, the several safety shut-off valves are positioned on each gas supply line in conventional configurations.

Gas injection nozzles 14 are coupled to gas supply ring manifold 16 and disperse deposition gases introduced into manifold 16 to a substrate 45 resting on a pedestal 44 within chamber 10. Additionally, a center gas injection nozzle (not shown) and a center annulus (not shown) admit gases to chamber 10 above substrate 45. Deposition gases introduced through gas injection nozzles 14, center gas injection nozzle, and center annulus may be of the same or different compositions. Pedestal 44 may be moved up and down by a motor (not shown) into various processing positions. Additionally, pedestal 44 may contain an electrostatic chuck or similar mechanism to restrain the wafer during processing and may also contain cooling passages and other features.

Gas supply ring manifold 16 is positioned within a housing 18. Housing 18 is protected from reagents by a skirt 46. Skirt 46 is composed of a substance, such as quartz, ceramic, silicon or polysilicon, which is resistant to the reagents used in the HDP-CVD process. The bottom of vacuum chamber 10 may include an annular liner 40, which itself may be made removable.

An inductively coupled plasma of the deposition gases can be formed adjacent to substrate 45 by RF energy applied to coiled antenna 26 from source RF generator 32. Source RF generator 32 can supply either single or mixed frequency RF power (or other desired variation) to coiled antenna 26 to enhance the decomposition of reactive species introduced into vacuum chamber 10. A plasma formed in such a manner has a relatively high density (on the order of $10^{11}$ to $10^{12}$ ions/cm$^3$) as compared with standard PECVD reactors. Deposition gases are exhausted from chamber 10 through exhaust line 23 as indicated by arrow 25. The rate at which gases are released through exhaust line 23 is controlled by throttle valve 12a.

Ceiling electrode 24 is held in place by a lid 56, which is cooled by cooling jackets 58. Ceiling electrode 24 is a conductor and may be connected to either ground, to a BRF generator 36, or left unconnected (allowed to float), by properly setting switch 38. Similarly, pedestal 44 may be connected to either ground, to a BRF generator 50 or left unconnected (allowed to float), by properly setting switch 52. The settings of these switches depends upon the plasma's desired characteristics. BRF generators 36 and 50 can supply either single or mixed frequency RF power (or other desired variation). BRF generators 36 and 50 may be separate RF generators, or may be a single RF generator connected to both ceiling electrode 24 and pedestal 44. Application of RF energy from BRF generators 36 and 50 to bias an inductively coupled plasma toward pedestal 44 promotes sputtering and enhances existing sputtering effects of the plasma (i.e., increasing the gap-fill capability of a film).

Capacitive coupling may also be used to form the plasma. Such a plasma may be formed between ceiling electrode 24 and pedestal 44 or in a similar fashion.

BRF generators 36 and 50, SRF generator 32, throttle valve 12a, the MFCs connected to lines 27, switches 30, 34, 38 and 52, and other elements in CVD system 5 are all controlled by a system controller 31 over control lines 35, only some of which are shown. System controller 31 operates under the control of a computer program stored in a computer-readable medium such as a memory 33, which, in the preferred embodiment is a hard disk drive. The computer program dictates the timing, introduction rate and mixture of gases, chamber pressure, chamber temperature, RF power levels and other parameters of a particular process. Motors and optical sensors are used to move and determine the position of movable mechanical assemblies such as throttle valve 12a and pedestal 44.

System controller 31 controls all of the activities of the CVD apparatus. In a preferred embodiment, controller 31 includes a hard disk drive (memory 33), a floppy disk drive, and a card rack. The card rack contains a single board computer (SBC) 37, analog and digital input/output boards, interface boards and stepper motor controller boards (only some of which are shown). The system controller conforms to the Versa Modular European (VME) standard which defines board, card cage, and connector dimensions and types. The VME also defines the bus structure having a 16-bit data bus and 24-bit address bus.

Figure 1B:
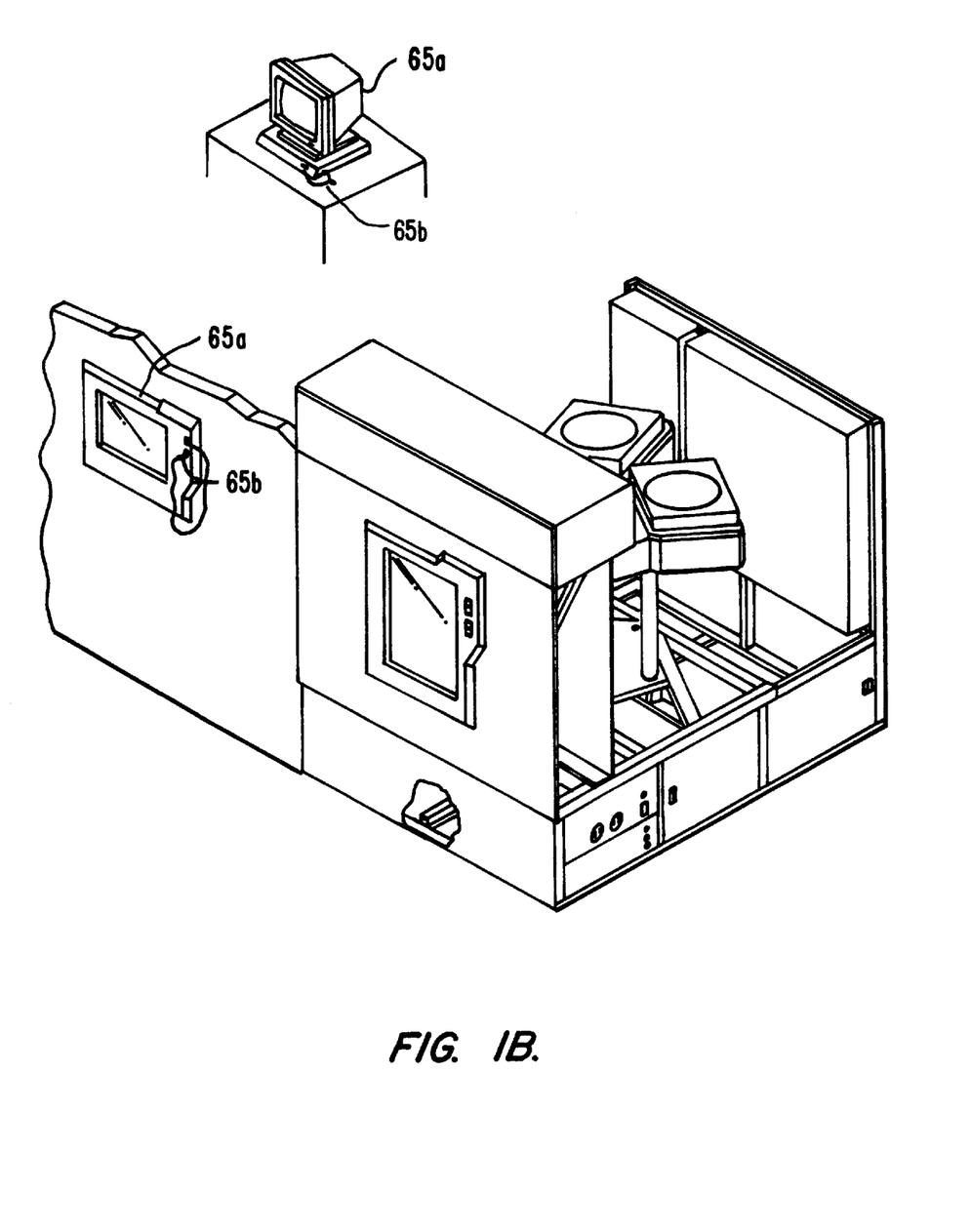
FIG. 1B is a diagram of an exemplary system monitor used in conjunction with the exemplary CVD processing chamber of FIG. 1A.

System controller 31 operates under the control of a computer program stored on the hard disk drive. The computer program dictates the timing, mixture of gases, RF power levels and other parameters of a particular process. The interface between a user and the system controller is via a CRT monitor 65a and a light pen 65b which is depicted in FIG. 1B. In the preferred embodiment two monitors 65a are used, one mounted in the clean room wall for the operators and the other behind the wall for the service technicians. Both monitors 65a simultaneously display the same information, but only one light pen 65b is enabled. Light pen 65b detects light emitted by CRT display with a light sensor in the tip of the pen. To select a particular screen or function, the operator touches a designated area of the display screen and pushes the button on pen 65b. The touched area changes its highlighted color, or a new menu or screen is displayed, confirming communication between the light pen and the display screen.

Figure 1C:
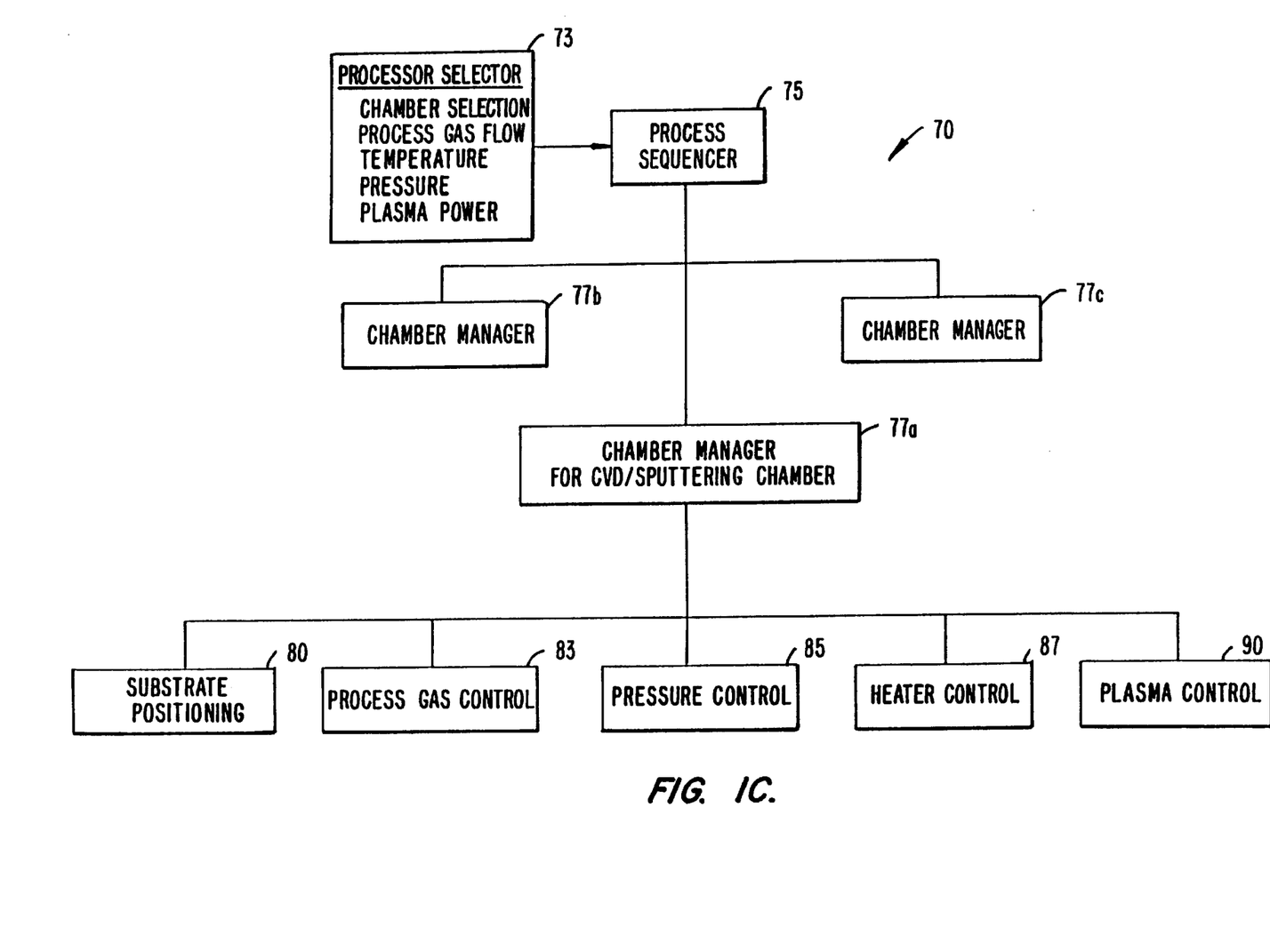
FIG. 1C is a flow chart of an exemplary process control computer program product used to control the CVD processing chamber of FIG. 1A.

The process can be implemented using a computer program product 141 that runs on, for example, system controller 31. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

FIG. 1C shows an illustrative block diagram of the hierarchical control structure of computer program 70. A user enters a process set number and process chamber number into a process selector subroutine 73 in response to menus or screens displayed on the CRT monitor by using the light pen interface. The process sets are predetermined sets of process parameters necessary to carry out specified processes, and are identified by predefined set numbers. The process selector subroutine 73 identifies (i) the desired process chamber in a multichamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe. The parameters specified by the recipe are entered utilizing the light pen/CRT monitor interface.

The signals for monitoring the process are provided by the analog input and digital input boards of system controller and the signals for controlling the process are output on the analog output and digital output boards of system controller 31.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so sequencer subroutine 75 operates to schedule the selected processes in the desired sequence. Preferably, sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 75 determines which process chamber and process set combination is going to be executed next, sequencer subroutine 75 causes execution of the process set by passing the particular process set parameters to a chamber manager subroutine 77a–c which controls multiple processing tasks in process chamber 10 according to the process set determined by sequencer subroutine 75. For example, chamber manager subroutine 77a comprises program code for controlling sputtering and CVD process operations in process chamber 10. Chamber manager subroutine 77a also controls execution of various chamber component subroutines which control operation of the chamber components necessary to carry out the selected process set.

Examples of chamber component subroutines are substrate positioning subroutine 80, process gas control subroutine 83, pressure control subroutine 85, heater control subroutine 87, and plasma control subroutine 90. Those having ordinary skill in the art will recognize that other chamber control subroutines can be included depending on what processes are desired to be performed in vacuum chamber 10. In operation, chamber manager subroutine 77a selectively schedules or calls the process component subroutines in accordance with the particular process set being executed. Scheduling by chamber manager subroutine 77a is performed in a manner similar to that used by sequencer subroutine 75 in scheduling which process chamber 10 and process set is to be executed. Typically, chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1C. Substrate positioning subroutine 80 comprises program code for controlling chamber components that are used to load a substrate onto pedestal 44 and to move the pedestal to a processing position. Substrate positioning subroutine 80 may also control transfer of a substrate into chamber 10 from, e.g., a PECVD reactor or other reactor in the multichamber system, after other processing has been completed.

Process gas control subroutine 83 has program code for controlling process gas composition and flow rates. Subroutine 83 controls the open/close position of the safety shut-off valves, and also ramps up/down the mass flow controllers to obtain the desired gas flow rate. All chamber component subroutines, including process gas control subroutine 83, are invoked by chamber manager subroutine 77a. Subroutine 83 receives process parameters from the chamber manager subroutine related to the desired gas flow rates.

Typically, process gas control subroutine 83 operates by opening the gas supply lines, and repeatedly (i) reading the necessary mass flow controllers, (ii) comparing the readings to the desired flow rates received from chamber manager subroutine 77a, and (iii) adjusting the flow rates of the gas supply lines as necessary. Furthermore, process gas control subroutine 83 includes steps for monitoring the gas flow rates for unsafe rates, and activating the safety shut-off valves when an unsafe condition is detected.

In some processes, an inert gas such as argon is flowed into chamber 10 to stabilize the pressure in the chamber before reactive process gases are introduced into the chamber. For these processes, the process gas control subroutine 83 is programmed to include steps for flowing the inert gas into chamber 10 for an amount of time necessary to stabilize the pressure in the chamber. The above-described steps may then be carried out.

Additionally, when a process gas is to be vaporized from a liquid precursor, the process gas control subroutine 83 includes steps for bubbling a delivery gas such as helium through the liquid precursor in a bubbler assembly or for introducing the helium to a liquid injection valve. For this type of process, the process gas control subroutine 83 regulates the flow of the delivery gas, the pressure in the bubbler, and the bubbler temperature to obtain the desired process gas flow rates. As discussed above, the desired process gas flow rates are transferred to process gas control subroutine 83 as process parameters.

Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 83 also controls the flow of heat-transfer gas, such as helium (He), through the inner and outer passages in the wafer chuck. The gas flow thermally couples the substrate to the chuck. In a typical process, the wafer is heated by the plasma and the chemical reactions that form the layer, and the He cools the substrate through the chuck. This keeps the substrate below a temperature that may damage preexisting features on the substrate.

Pressure control subroutine 85 includes program code for controlling the pressure in chamber 10 by regulating the size of the opening of throttle valve 12a in the exhaust portion of the chamber. The size of the opening of throttle valve 12a is set to control the chamber pressure to the desired level in relation to the total process gas flow, size of the process chamber, and pumping setpoint pressure for the exhaust system. When pressure control subroutine 85 is invoked, the desired, or target, pressure level is received as a parameter from chamber manager subroutine 77a. Pressure control subroutine 147 operates to measure the pressure in chamber 10 by reading one or more conventional pressure manometers connected to the chamber, compare the measure value (s) to the target pressure, obtain proportional, integral, and differential (PID) values from a stored pressure table corresponding to the target pressure, and adjust the throttle valve 12a according to the PID values obtained from the pressure table. Alternatively, pressure control subroutine 85 can be written to open or close throttle valve 12a to a particular opening size to regulate chamber 10 to attain a desired pressure.

Plasma control subroutine 90 comprises program code for setting the RF power level applied to RF generators 32, 36 and 50 in chamber 10, and optionally, to set the level of the magnetic field generated in the chamber. The plasma control subroutine 90, like the previously described chamber component subroutines, is invoked by chamber manager subroutine 77a.

An example of such an HDP-CVD apparatus along with the advantages of each of the three capacitively coupled configurations and the specific details concerning the inductively coupled configurations is described in U.S. patent application Ser. No. 08/234,746 entitled "High Density Plasma CVD Reactor with Combined Inductive and Capacitive Coupling," by Nowak, Fairbairn and Redeker, filed Apr. 26, 1994, the disclosure of which is incorporated herein by reference.

The above description is for illustrative purposes only and should not be considered as limiting the scope of the present invention. Variations of the above-described system, such as variations in pedestal design, chamber design, location of RF power connections and other variations are possible. Additionally, other systems such as electron cyclotron resonance (ECR) plasma CVD devices, thermal CVD devices, PECVD systems, sputtering systems or the like, can enjoy the benefits of the present invention. The method and apparatus of the present invention are not limited to any specific substrate processing system.

II. Depositing Protective Seasoning Layers

The present invention may be employed to reduce the amount of contaminants present during substrate processing that originate from components in the interior of a substrate processing chamber, such as the exemplary chamber described. Contaminant reduction is obtained by depositing a protective seasoning layer over walls and insulation areas within the interior of the chamber that could otherwise be a source of such contaminants. The protective seasoning layer formed according to the present invention has a lower diffusion rate for typical contaminants in relation to the chamber components, which in turn reduces contaminant levels during substrate processing.

Figure 2:
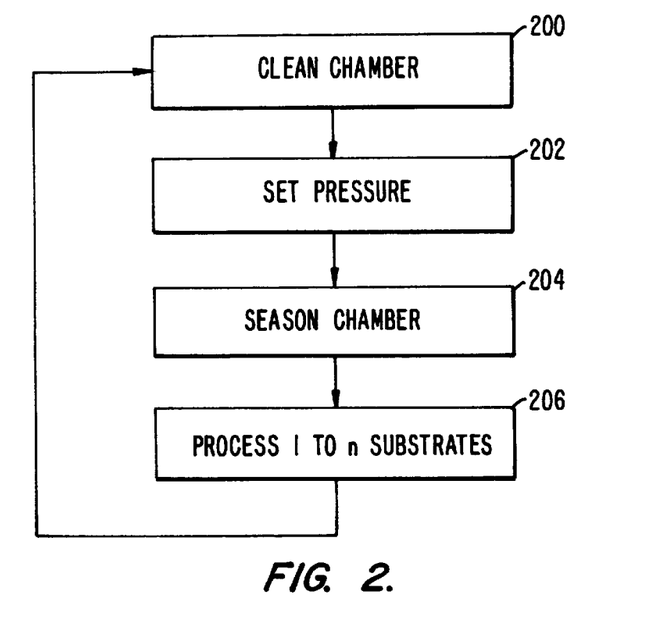
FIG. 2 is a flow chart illustrating process steps in the formation of a protective seasoning film according to an embodiment of the present invention.

FIG. 2 illustrates a preferred process for depositing a protective seasoning layer of silicon nitride according to the present invention. This process is implemented and controlled using a computer program stored in the memory 33 of CVD system 5. In this preferred embodiment, the protective seasoning layer is deposited after completion of a standard chamber clean operation (step 200) in which an etchant gas such as $NF_3$ is introduced into the chamber to remove material deposited on the chamber walls from a previous deposition step (e.g., step 206). In preparation for deposition of the seasoning layer, the chamber is pressurized to a setpoint of 40 mTorr (step 202). In seasoning step 204, the source generator is set to 2500 W and the bias generator is set to 0 W. A process gas that includes nitrogen ($N_2$) and silane ($SiH_4$) is introduced into the chamber to deposit the silicon nitride (SiN) protective seasoning layer. Nitrogen is introduced at a rate of 120 sccm, while silane is introduced at a rate of 90 sccm. Seasoning step 204 is preferably carried out for 100 seconds. After seasoning step 204 is complete, a protective seasoning layer of SiN substantially covers the chamber that has a lower diffusion rate for typical contaminants in relation to the chamber components, which in turn reduces contaminant levels during substrate processing. The illustrated seasoning step introduces silicon nitride as the seasoning layer into the process chamber. However, other seasoning layers, such as silicon oxynitride (SiON) and phosphorous-doped silicate glass (PSG), each of which limits the diffusion of contaminates into the deposition chamber, may be substituted for SiN. Following seasoning step 204, substrate processing may be carried out in step 206 until the chamber needs to be cleaned and seasoned again.

Figure 3:
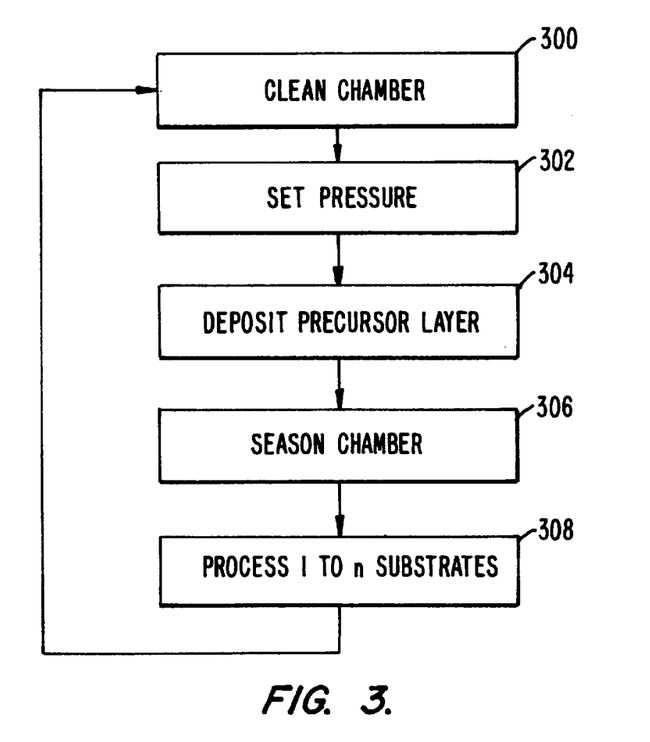
FIG. 3 is a flow chart illustrating process steps in the formation of a protective seasoning film according to another embodiment of the present invention.

FIG. 3 illustrates an alternate process of the invention in which a precursor layer is deposited in the chamber prior to deposition of the seasoning layer described in FIG. 2. This process is again implemented and controlled using a computer program stored in the memory 33 of CVD system 5. In initial step 300, the chamber is again cleaned as described above (step 200). The chamber is again pressurized to a setpoint of 40 mTorr (step 302). Now, rather than proceeding directly to seasoning the chamber with a protective layer, a precursor layer of silicon oxide ($SiO_2$) is first introduced into the chamber in step 304. Here, the source generator is set to 4500 W and the bias generator is set to 1600 W. A process gas that includes argon (Ar), oxygen ($O_2$) and silane ($SiH_4$) is introduced into the chamber. Argon is introduced at a rate of 20 sccm, oxygen is introduced at a rate of 140 sccm and silane is introduced at a rate of 90 sccm. Precursor deposition step 304 is preferably carried out for 30 seconds. After depositing the precursor layer of $SiO_2$ in the chamber, a seasoning layer is deposited into the chamber over the precursor layer in step 306, where the parameters are identical to those described above for FIG. 2 (step 204). Depositing a precursor layer offers the following advantage: the protective seasoning layer deposited in step 306 adheres more uniformly to the underlying precursor layer than directly to the chamber components. Thus, the protective seasoning layer is less likely to chip and become fragmented when deposited over a precursor layer rather than directly over the chamber components, improving contamination control. Again, other protective seasoning layers, such as silicon oxynitride (SiON) and phosphorous-doped silicate glass (PSG), for example, may be deposited into the chamber in place of silicon nitride. Following seasoning step 306, substrate processing may be carried out in step 308 until the chamber needs to be cleaned and seasoned again.

Figure 4:
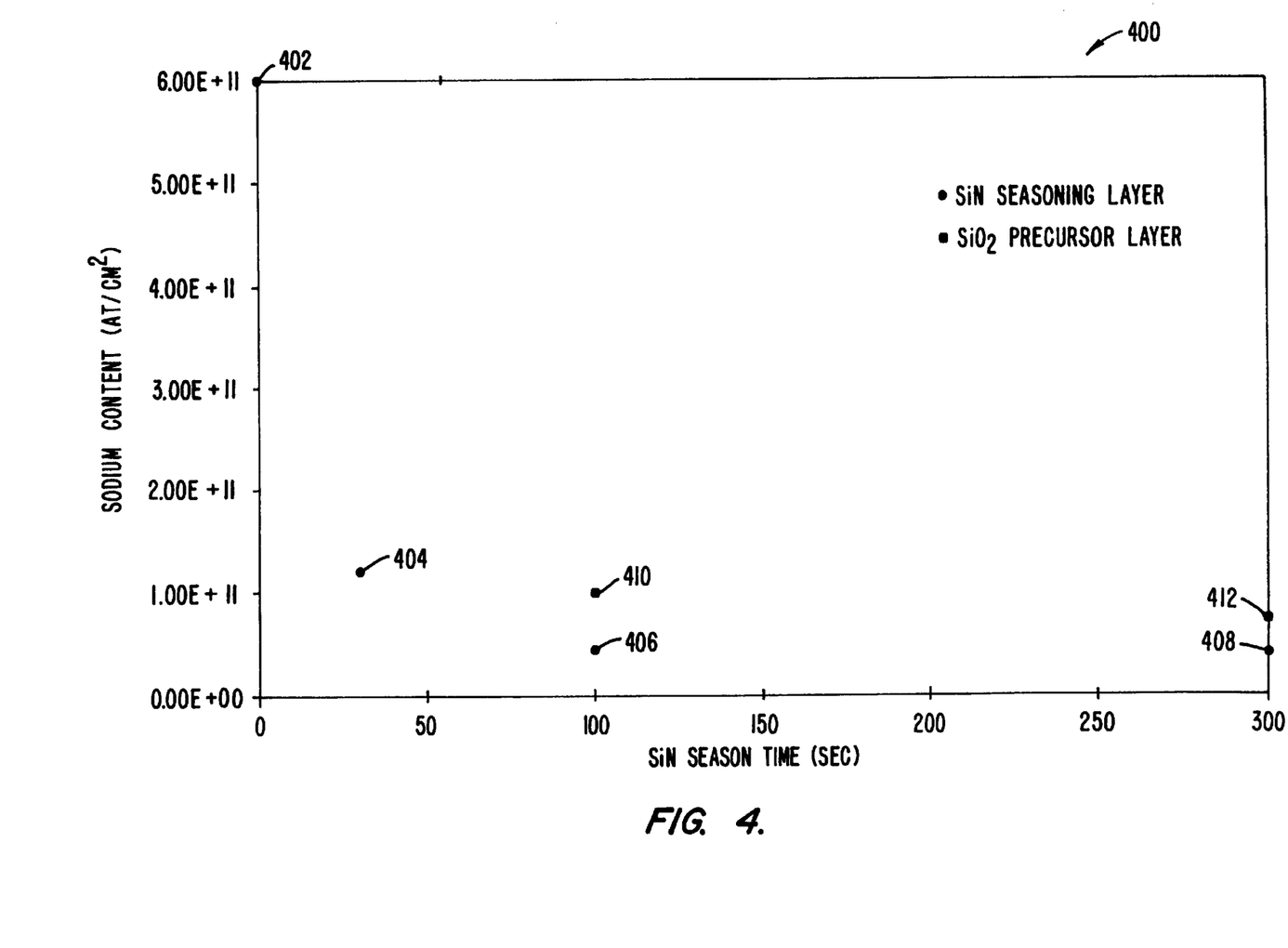
FIG. 4 is a graph showing the reduction in sodium contamination after the formation of a protective seasoning film according to the present invention.

FIG. 4 is a graph 400 illustrating the reduction in sodium contamination after the formation of a protective seasoning film according to the present invention. The vertical axis shows the sodium content of a substrate processing chamber as a function of the seasoning time in seconds of a silicon nitride protective seasoning layer. The sodium content was measured by performing a SIMS analysis. Point 402 shows that if a silicon nitride seasoning layer is not deposited in the chamber, the sodium content is about $6.0 \times 10^{11}$ atoms/cm$^2$. This level of sodium content in the processing chamber is unacceptable for some applications and can cause device performance degradation. Acceptable sodium content levels for many applications are typically below about $1.0 \times 10^{11}$ atoms/cm$^2$. Point 404 shows that, after about 30 seconds of SiN seasoning according to the process described in FIG. 2, the sodium content in the chamber has dropped to about $1.2 \times 10^{11}$ atoms/cm$^2$, which is a significant improvement and a nearly acceptable content level. Point 406 shows that after 100 seconds of SiN seasoning, the sodium content drops below about $5.0 \times 10^{10}$ atoms/cm$^2$, which is now within acceptable content levels. Additional seasoning maintains acceptable sodium content levels, as illustrated by point 408, where the sodium content remains consistent, below about $5.0 \times 10^{10}$ atoms/cm$^2$ after seasoning the chamber with SiN for 300 seconds.

Graph 400 also shows the effect of forming a precursor seasoning layer according to the process described in FIG. 3. Point 410 shows that after depositing a precursor $SiO_2$ layer followed by 100 seconds of SiN seasoning, the sodium content of the chamber is about $1.0 \times 10^{11}$ atoms/cm$^2$. The sodium content of the chamber with a precursor $SiO_2$ layer is therefore higher than with no precursor layer (point 406), but the precursor layer offers the benefits described above, such as the fact that the protective seasoning layer adheres more uniformly to the underlying precursor layer than to the chamber components. Thus, the protective seasoning layer is less likely to chip and become fragmented when deposited over a precursor layer rather than directly over the chamber components, improving contamination control. Point 412 shows that there is some improvement with an increase in seasoning time when depositing SiN over a precursor layer. After 300 seconds of SiN seasoning over a precursor $SiO_2$ layer, the sodium content is about $7.0 \times 10^{10}$ atoms/cm$^2$. The above values were measured in a HDP-CVD chamber; sodium content may differ in other chambers.

The present invention has now been explained with reference to specific embodiments. Other embodiments will be apparent to those of ordinary skill in the art. It is therefore not intended that this invention be limited except as indicated by the appended claims.

What is claimed is:

1. A method of operating a substrate processing chamber having components with surfaces inside said chamber, said components containing contaminants, said method comprising the steps of:

depositing a precursor seasoning film substantially covering at least a portion of said surfaces of said components of said chamber; and thereafter, depositing a protective seasoning film substantially covering at least a portion of said precursor seasoning film, wherein said contaminants have a lower diffusion rate in said protective seasoning film than in said components of said chamber.

2. The method of claim 1 wherein said protective seasoning film comprises silicon nitride (SiN).

3. The method of claim 1 wherein said protective seasoning film comprises silicon oxynitride (SiON).

4. The method of claim 1 wherein said protective seasoning film comprises phosphorous-doped silicate glass (PSG).

5. The method of claim 1 wherein said contaminants comprise sodium (Na).

6. The method of claim 1 wherein said contaminants comprise lithium (Li).

7. The method of claim 1 wherein said contaminants comprise potassium (K).

8. The method of claim 1 wherein said precursor seasoning film comprises undoped silicon oxide ($SiO_2$).

* * * * *